US012721024B2

(12) United States Patent
Kim et al.

(10) Patent No.: US 12,721,024 B2
(45) Date of Patent: Aug. 25, 2026

(54) MASK STAGE AND METHOD OF MANUFACTURING MASK ASSEMBLY

(71) Applicant: Samsung Display Co., Ltd., Yongin-si (KR)

(72) Inventors: Myungkyu Kim, Yongin-si (KR); Changkon Park, Yongin-si (KR); Sukbeom You, Yongin-si (KR); Dongjae Lee, Yongin-si (KR); Kyongho Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 637 days.

(21) Appl. No.: 18/079,966

(22) Filed: Dec. 13, 2022

(65) Prior Publication Data

US 2023/0189625 A1 Jun. 15, 2023

(30) Foreign Application Priority Data

Dec. 13, 2021 (KR) ........................ 10-2021-0178033

(51) Int. Cl.
*H10K 71/00* (2023.01)
*C23C 14/04* (2006.01)

(52) U.S. Cl.
CPC ........... *H10K 71/00* (2023.02); *C23C 14/042* (2013.01)

(58) Field of Classification Search
CPC ...... H10K 71/00; H10K 59/12; H10K 71/166; C23C 14/042; C23C 14/24
See application file for complete search history.

(56) References Cited

U.S. PATENT DOCUMENTS

2014/0158044 A1 6/2014 Han
2014/0199500 A1* 7/2014 van Kessel .............. B05D 1/00 118/308
2016/0310988 A1 10/2016 Lee et al.
2018/0363127 A1* 12/2018 Bucci ...................... C23C 16/04
2022/0359852 A1* 11/2022 Wang ..................... H10K 59/35

FOREIGN PATENT DOCUMENTS

JP 2005-079368 3/2005
KR 10-1025086 3/2011
KR 10-1212244 12/2012
KR 10-1228622 2/2013
KR 20140074614 A 6/2014
KR 10-2015-0077130 7/2015
KR 10-2015-0102454 9/2015
KR 10-1655993 9/2016
KR 20160127888 A 11/2016

* cited by examiner

*Primary Examiner* — Fernando L Toledo
*Assistant Examiner* — Jorge Andres Lopez
(74) *Attorney, Agent, or Firm* — CANTOR COLBURN LLP

(57) ABSTRACT

A mask stage includes plates disposed adjacent to each other, the plates forming a closed loop in a plan view, and a connection portion connecting adjacent ones among the plates to each other, the connection portion being detachable from the plates. The mask stage supports a mask frame.

11 Claims, 9 Drawing Sheets

MASK STAGE AND METHOD OF MANUFACTURING MASK ASSEMBLY

CROSS-REFERENCE TO RELATED APPLICATION(S)

This application claims priority to and benefits of Korean Patent Application No. 10-2021-0178033 under 35 U.S.C. § 119, filed on Dec. 13, 2021, in the Korean Intellectual Property Office, the entire contents of which is incorporated herein by reference.

BACKGROUND

1. Technical Field

The embodiments relate to a mask stage and a method of manufacturing a mask assembly where the flatness of the mask assembly may be easily adjusted.

2. Description of the Related Art

Electronic devices, such as smartphones, digital cameras, notebook computers, navigation systems, and smart televisions that provide images to users, include a display device for displaying images. The display device generates an image and provides the image to a user on a display screen.

The display device is manufactured by depositing various layers such as an organic layer and a metal layer. A deposition device may be used to process multiple layers in the manufacture of the display device. The deposition device may deposit deposition materials from a deposition source onto a substrate through a mask assembly.

The mask assembly may include a mask frame and a mask sheet, and may be manufactured while seated on a mask stage. The mask assembly is placed adjacent to the substrate to allow the deposition material to pass through, it is important that the mask assembly has a uniform flatness.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The embodiments include a mask stage and a method of manufacturing a mask assembly where the flatness of the mask assembly may be easily adjusted.

However, this is merely an example, and the scope of the disclosure is not limited thereto.

Additional aspects will be set forth in part in the description which follows and, in part, will be apparent from the description, or may be learned by practice of the embodiments of the disclosure.

According to the embodiments, a mask stage may include plates disposed adjacent to each other, the plates forming a closed loop in a plan view, and a connection portion connecting adjacent ones among the plates to each other, the connection portion being detachable from the plates. The mask state may support a mask frame.

In the embodiments, a first plate among the plates and a second plate among the plates may be adjacent to each other. The connection portion may be disposed on an upper portion of the plates, the connection portion overlapping portions of the first plate and the second plate, in a thickness direction of the plates.

In the embodiments, the connection portion, the first plate, and the second plate may be fastened together by a fastener.

In the embodiments, each of the plates may include a first area in which the connection portion is seated, and a second area connected to the first area. A thickness of the plates in the first area may be less than another thickness of the plates in the second area.

In the embodiments, a sum of the thickness of the plates in the first area and a thickness of the connection portion may be greater than the another thickness of the plates in the second area.

In the embodiments, the first area may further include a height adjustment part disposed between the plates and the connection portion.

In the embodiments, the height adjustment part may include a shim.

In the embodiments, the connection portion may include a first block disposed in an inner direction with respect to the closed loop, and a second block disposed in an outer direction with respect to the closed loop and disposed parallel to the first block.

In the embodiments, an area of the first block in a plan view may be different from an area of the second block in a plan view.

In the embodiments, the connection portion may include an air hole that passes through the inside of the connection portion and injects air in a direction opposite to a direction in which the mask frame is supported.

In the embodiments, air holes may be spaced apart from each other in a longitudinal direction and a width direction of the connection portion.

According to the embodiments, a mask stage may comprise sides forming a closed loop. The sides may include plates and connection portions connecting adjacent ones among the plates, the connection portions being detachable from the plates. Heights of the connection portions may be different from each other at each point.

In the embodiments, the mask stage may further include a shim inserted onto a lower portion of the connection portions.

In the embodiments, the connection portions may overlap portions of adjacent ones among the plates in a thickness direction of the plates.

In the embodiments, each the connection portions may include an air hole that passes through the inside of the connection portions and injects air in an external direction of the connection portions.

According to the embodiments, a method of manufacturing a mask assembly includes disposing plates adjacent to each other, the plates forming a closed loop in a plan view, disposing a connection portion to connect between the plates thereby connecting the plates, disposing a mask frame on the connection portion, adjusting a height of the connection portion, and disposing a mask sheet on the mask frame.

In the embodiments, the disposing of the connection portion may include disposing the connection portion to overlap portions of adjacent ones among the plates.

In the embodiments, the disposing of the connection portion may include disposing the connection portion such that a height of the connection portion is greater than a height of the plates.

In the embodiments, the adjusting of the height of the connection portion may include inserting a shim between the plates and the connection portion.

In the embodiments, the method may further include injecting air toward a surface of the mask frame that contacts the connection portion.

In the embodiments, the injecting of air may include injecting air through air holes disposed in the connection portion.

In the embodiments, the injected air may be discharged through a space between the mask frame and the plates.

These and/or other aspects will become apparent and more readily appreciated from the following description of the embodiments, taken in conjunction with the accompanying drawings.

BRIEF DESCRIPTION OF THE DRAWINGS

The above and other aspects, features, and advantages of the disclosure will be more apparent by describing in detail embodiments thereof with reference to the attached drawings, in which.

DETAILED DESCRIPTION OF THE EMBODIMENTS

Figure 1:
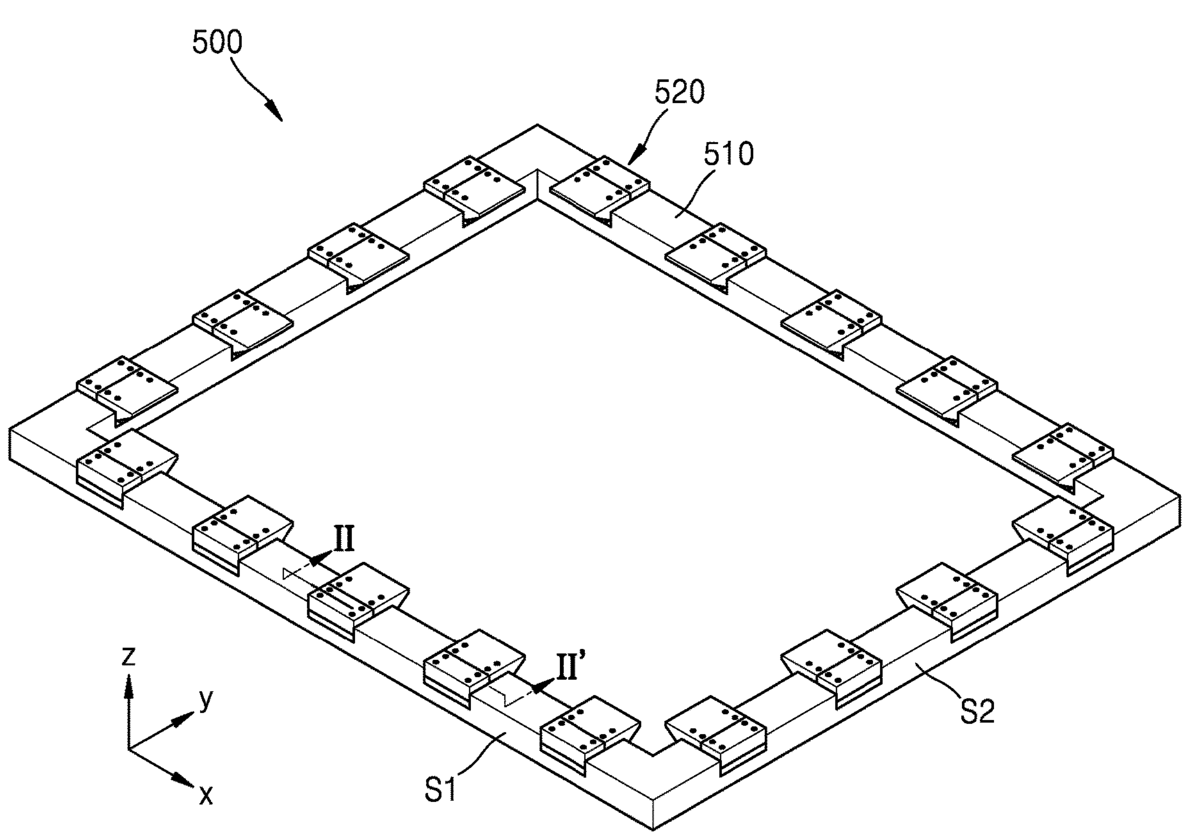
FIG. 1 is a perspective view schematically illustrating a mask stage according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

Since the disclosure may have diverse modified embodiments, embodiments are illustrated in the drawings and are described in the detailed description. Advantages and features of the disclosure, and implementation methods thereof will be clarified through following embodiments described with reference to the accompanying drawings. The disclosure may, however, be embodied in many different forms and should not be construed as limited to the embodiments set forth herein.

Reference will now be made in detail to embodiments, examples of which are illustrated in the accompanying drawings, wherein like reference numerals refer to like elements throughout, and repeated description thereof will be omitted.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

As used herein, the singular forms, "a," "an," and "the" are intended to include the plural forms as well, unless the context clearly indicates otherwise.

It will be further understood that the terms "comprises" and/or "comprising" used herein specify the presence of stated features or elements, but do not preclude the presence or addition of one or more other features or elements.

It will be understood that when a layer, area, or element is referred to as being "formed on" another layer, area, or element, it can be directly or indirectly formed on the other layer, area, or element. For example, intervening layers, areas, or elements may be present.

Sizes of elements in the drawings may be exaggerated for convenience of description. The sizes and thicknesses of components in the drawings are arbitrarily illustrated for convenience of description, the following embodiments are not limited thereto.

In the following embodiments, an x-axis, a y-axis, and a z-axis are not limited to three axes on an orthogonal coordinate system and may be widely understood. For example, the x-axis, the y-axis, and the z-axis may be perpendicular to one another, or may represent different directions that are not perpendicular to one another.

When an embodiment may be implemented differently, a specific process order may be performed differently from the described order. For example, two consecutively described processes may be performed substantially at the same time or performed in an order opposite to the described order.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a mask stage 500 according to an embodiment will be described with reference to the drawings.

FIG. 1 is a perspective view schematically illustrating the mask stage 500 according to an embodiment.

Referring to FIG. 1, the mask stage 500 is a member for supporting a mask frame, and may support a mask assembly in a mask assembly manufacturing apparatus and/or a display device manufacturing apparatus, as described below. Hereinafter, for convenience of description, the mask stage 500 is described as being used in the mask assembly manufacturing apparatus.

Because a mask frame is seated on the mask stage 500, a closed loop may be formed to correspond to the shape of the mask frame. In an embodiment, the mask stage 500 may have a rectangular frame shape having an opening in the center of the mask stage 500.

The mask stage 500 may include a first side S1 extending in a first direction (e.g., the x direction of FIG. 1). The first side S1 may be a pair of sides disposed to face each other and to be parallel to each other. The mask stage 500 may include a second side S2 extending in a second direction (e.g., the y direction of FIG. 1). The second side S2 may be formed as a pair of sides arranged to face each other and parallel to each other. The first side S1 and the second side S2 may intersect each other, for example, may intersect each other at right angles. The profile of the mask stage 500 formed by the first side S1 and the second side S2 may be rectangular.

In an embodiment, the first side S1 may be longer than the second side S2, and the second side S2 may be shorter than the first side S1. However, the disclosure is not limited thereto, and in other embodiments, the first side S1 may be a short side and the second side S2 may be a long side. In other examples, the first side S1 and the second side S2 may have substantially the same length. Hereinafter, the first side S1 is described as the long side and the second side S2 as the short side.

Each of the first side S1 and the second side S2 may include plates 510 and connection portions 520. Because a plate 510 and a connection portion 520 constituting the first side S1 and the second side S2 are similar to each other, the following description is based on the first side S1.

The first side S1 may include separated plates 510. The connection portion 520 may be disposed between the plates 510 to connect two adjacent plates 510. The connection portions 520 may be arranged to be apart from each other in a direction extending along the first side S1, for example, in the first direction (e.g., the x direction in FIG. 1). As described above, the mask stage 500 may be formed by assembling the plates 510 instead of a single plate. A mask stage made of a single plate has a problem in that flatness is not constant as the size of the mask stage increases. The mask stage 500 according to an embodiment may be separated and assembled, thereby reducing the flatness distribution of the mask stage 500. A mask stage corresponding to the size of the mask frame may be assembled by assembling the plate 510 and the connection portion 520 according to the size of the mask frame.

Figure 2:
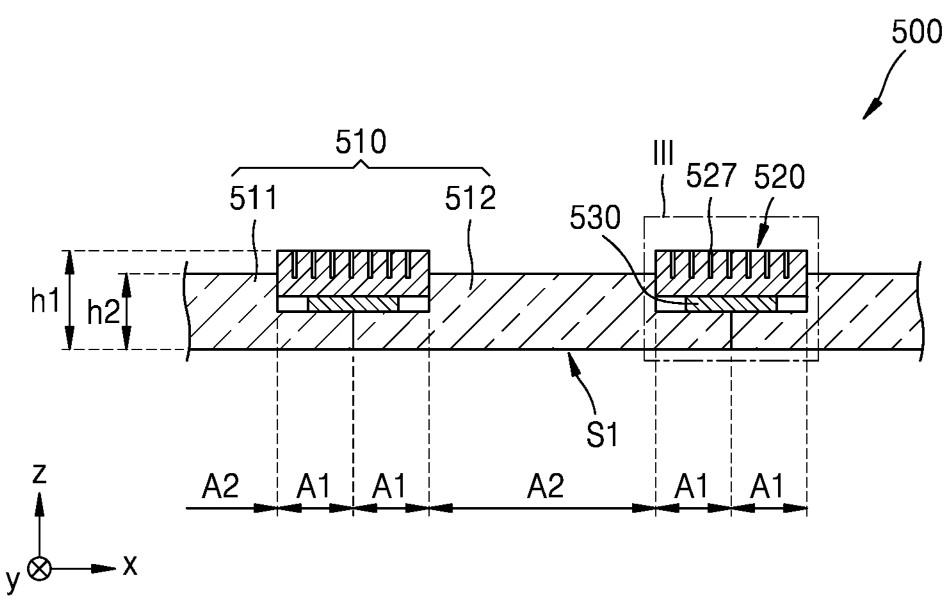
FIG. 2 is a schematic cross-sectional view of the mask stage, taken along line II-II' of FIG. 1.

FIG. 2 is a schematic cross-sectional view of the mask stage 500, taken along line II-II' of FIG. 1.

Referring to FIG. 2, the plates 510 may be arranged side-by-side adjacent to each other. Hereinafter, the first plate 511 and the second plate 512 which are adjacent to each other will be described.

The first plate 511 and the second plate 512 may be arranged side-by-side in the direction extending along the first side S1 (the x direction in FIG. 2), and may be connected to each other by the connection portion 520. The connection portion 520 may overlap portions of the first plate 511 and the second plate 512, the first plate 511 may be on one side of the connection portion 520 (e.g., opposite of the x direction in FIG. 2), and the second plate 512 may be on the opposite side of the connection portion 520 (e.g., the x direction in FIG. 2).

In an embodiment, a thickness of the plate 510 may be different in a longitudinal direction of the plate 510 (the x direction in FIG. 2). Each of the first plate 511 and the second plate 512 may include a first area A1 in which the connection portion 520 is seated. Each of the first plate 511 and the second plate 512 may include a second area A2 that is connected to the first area A1 and is an area in which the connection portion 520 is not seated. The thickness of the first area A1 (a length in the z direction in FIG. 2) may be less than the thickness of the second area A2. Accordingly, a groove is formed by the relatively smaller thickness of the first area A1 of the first plate 511 and the second plate 512, and the connection portion 520 may be seated in the groove.

In an embodiment, a height h1 of the mask stage 500 in the first area A1, a sum of the thickness of the first plate 511 and the height of the connection portion 520 in the first area A1, may be greater than a height h2 of the mask stage 500 in the second area A2, the thickness of the first plate 511 in the second area A2. Accordingly, a mask frame supported by the mask stage 500 may be seated in and supported by the connection portion 520.

The mask stage 500 may include a height adjustment part 530 disposed between the plate 510 and the connection portion 520. The height adjustment part 530 may be inserted onto a lower surface of the connection portion 520 (e.g., opposite of the z direction in FIG. 2). The height adjustment part 530 may move the connection portion 520 supporting the mask frame upward or downward.

Accordingly, the flatness of the mask frame may also be adjusted by adjusting the height of the mask stage 500. The mask sheet seated on the mask frame needs to be seated flat at the same height without sagging or the like. However, because the thickness of the mask stage 500 may not be flat, or the thickness of the mask frame may not be flat, a problem that may occur is that the mask sheet may not be seated on the mask frame at the same height. The mask stage 500 according to an embodiment may adjust the height of the connection portion 520 through the height adjustment part 530, thereby adjusting the height of the mask frame. Accordingly, the mask sheet seated on the mask frame may be seated flatly and at the same height at all points of the mask sheet. The height referred to herein indicates the height from the lower surface of the mask stage 500 which begins at the lower surface of the plate 510. For example, the height of the connection portion 520 indicates a length from the lower surface of the plate 510 to an upper surface of the connection portion 520.

Figure 3:
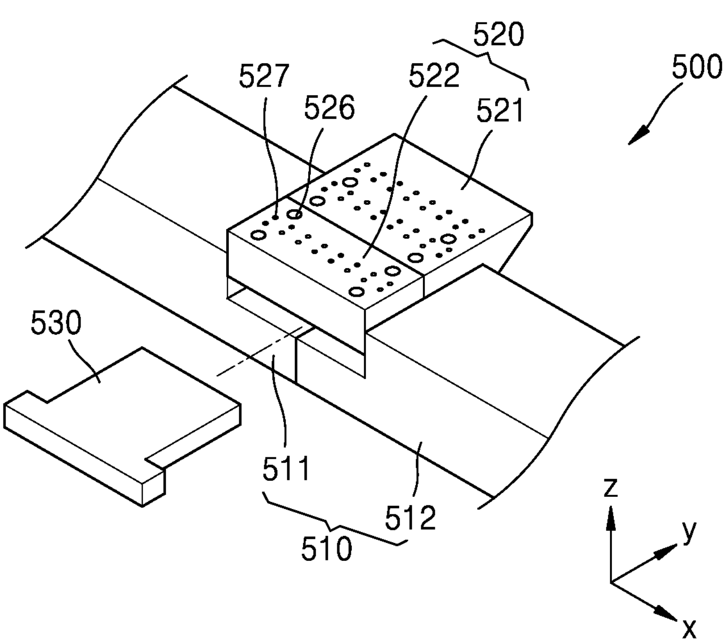
FIG. 3 is an enlarged perspective view schematically illustrating section III of the mask stage 500 of FIG. 2.

FIG. 3 is an enlarged perspective view schematically illustrating section III of the mask stage 500 of FIG. 2.

Referring to FIGS. 2 and 3, the connection portion 520 may include a first block 521 and a second block 522. The first block 521 may be disposed inside the closed loop of the mask stage 500, in a direction toward the center of the closed loop (disposed in an inner direction with respect to the closed loop). The second block 522 may be disposed towards the outer edge the closed loop of the mask stage 500, in a direction opposite to the center of the closed loop (disposed in an outer direction with respect to the closed loop). For example, the first block 521 and the second block 522 may be arranged adjacent to each other in a direction perpendicular to a longitudinal direction of the first side S1 (e.g., they direction in FIG. 3).

In an embodiment, the first block 521 may be convex towards the center of the closed loop (for example, a wedge shape towards the center). A cross-sectional area in a plan view of the first block 521 may decrease from the top to the bottom of the first block 521. In an embodiment, the second block 522 may be formed in a rectangular parallelepiped shape (or a rectangular block shape).

In an embodiment, areas of the first block 521 and the second block 522 in a plan view may be different. For example, the area of the first block 521 may be greater than the area of the second block 522.

The first block 521 and the second block 522 may be fixed to the plate 510. The first block 521 and the second block 522 may include a through hole 526 in an embodiment. The through hole 526 may pass through the first block 521 and the second block 522, and may include a thread therein. In an embodiment, through holes 526 may be formed, and FIG. 3 illustrates that eight through holes 526 are formed as an example, but the disclosure is not limited thereto.

A fastener, for example, a bolt, may be inserted into the through hole 526. The bolt may be inserted into the plate 510 under the connection portion 520 through the through hole 526. The plate 510 may also include an accommodating part for accommodating the bolt. Accordingly, the connection portion 520 and the plate 510 may be coupled to each other by a fastener, for example, a bolt.

In an embodiment, the connection portion 520 may further include an air hole 527. The air hole 527 may extend inward from the upper surface (a plane in the z direction of FIG. 3) of the connection portion 520. The first block 521 and the second block 522, and may be connected to an external air supply device (not shown). The air supply device may supply air to the air hole 527 and the air may be discharged from the inside of the connection portion 520 through the air hole 527. The air hole 527 may be formed perpendicular to the upper surface of the connection portion 520, and thus, air may be discharged in a direction opposing the direction of gravity on the mask frame seated on the upper surface of the connection portion 520. The air hole 527 injects air in the opposite direction to the direction in which the mask frame is supported. This may reduce the frictional force between the upper surface of the connection portion 520 and the mask frame. Therefore, asymmetric deformation of the mask frame due to the frictional force of the connection portion 520 may be minimized.

Multiple air holes 527 may be formed. FIG. 3, as an example, shows six (6) rows of eight (8) air holes 527 in each row, but the disclosure is not limited thereto.

Referring back to FIG. 3, the height adjustment part 530 may be disposed between the connection portion 520 and the plate 510.

In an embodiment, the height adjustment part 530 may include a shim inserted between the connection portion 520 and the plate 510. The shim may be a plate with a thickness. By varying the thickness of the shim or inserting shims, the height of the connection portion 520 may be adjusted to a desired height. In an embodiment, the shape of the shim may be a T-shape. This may prevent the shim from interfering with the bolt inserted into the plate 510 through the through hole 526.

Although not shown in the drawings, the height adjustment part 530 may further include a driving part capable of moving the shim up and down. The driving part connected to the shim may move the shim up and down to adjust the height of the connection portion 520. When the connection portion 520 is located at a desired height, the height of the connection portion 520 may be fixed by fixing the position of the shim. Accordingly, the height of the connection portion 520 may be easily adjusted without inserting multiple shims or changing the thickness of the shim.

As such, the mask stage 500 according to an embodiment may adjust positions of the connection portions 520, and thus the height of the mask frame seated on the connection portion 520 may be adjusted at various points.

Figure 4:
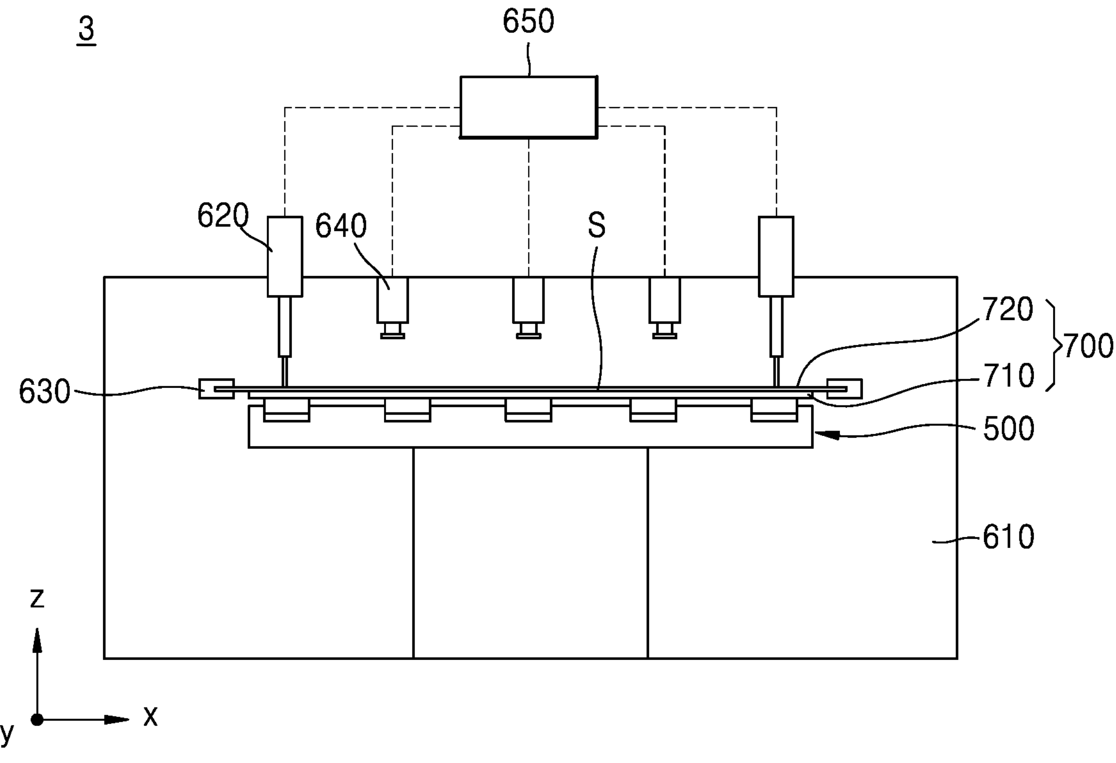
FIG. 4 is a schematic view illustrating a mask assembly manufacturing apparatus according to an embodiment.

FIG. 4 is a schematic view illustrating a mask assembly manufacturing apparatus according to an embodiment.

Referring to FIG. 4, a mask assembly manufacturing apparatus 3 may include a chamber 610, a welding part 620, a clamp 630, a vision part 640, a controller 650, and a mask stage 500. The mask stage 500 of the mask assembly manufacturing apparatus 3 may be the mask stage 500 described above, but is not limited thereto.

In the operation of the mask assembly manufacturing apparatus 3 as described above, after a mask frame 710 is seated on the mask stage 500, a mask sheet 720 may be clamped by the clamp 630. The mask sheet 720 may be stretched in a longitudinal direction of the mask sheet 720 after being clamped by the clamp 630.

After stretching the mask sheet 720, the welding part 620 may weld the mask sheet 720 to the mask frame 710. Thereafter, a part of the mask sheet 720 may be cut to complete the manufacture of the mask assembly 700.

While the above operation is in progress, the vision part 640 detects positions of the mask sheet 720 and the mask frame 710 to align the positions of at least one of the mask sheet 720 and the mask frame 710. The vision part 640 may check whether welding has been performed accurately by photographing the welding position or the like.

The controller 650 may control each component of the mask assembly manufacturing apparatus 3. The controller 650 may be provided for each of the components individually.

Figure 5:
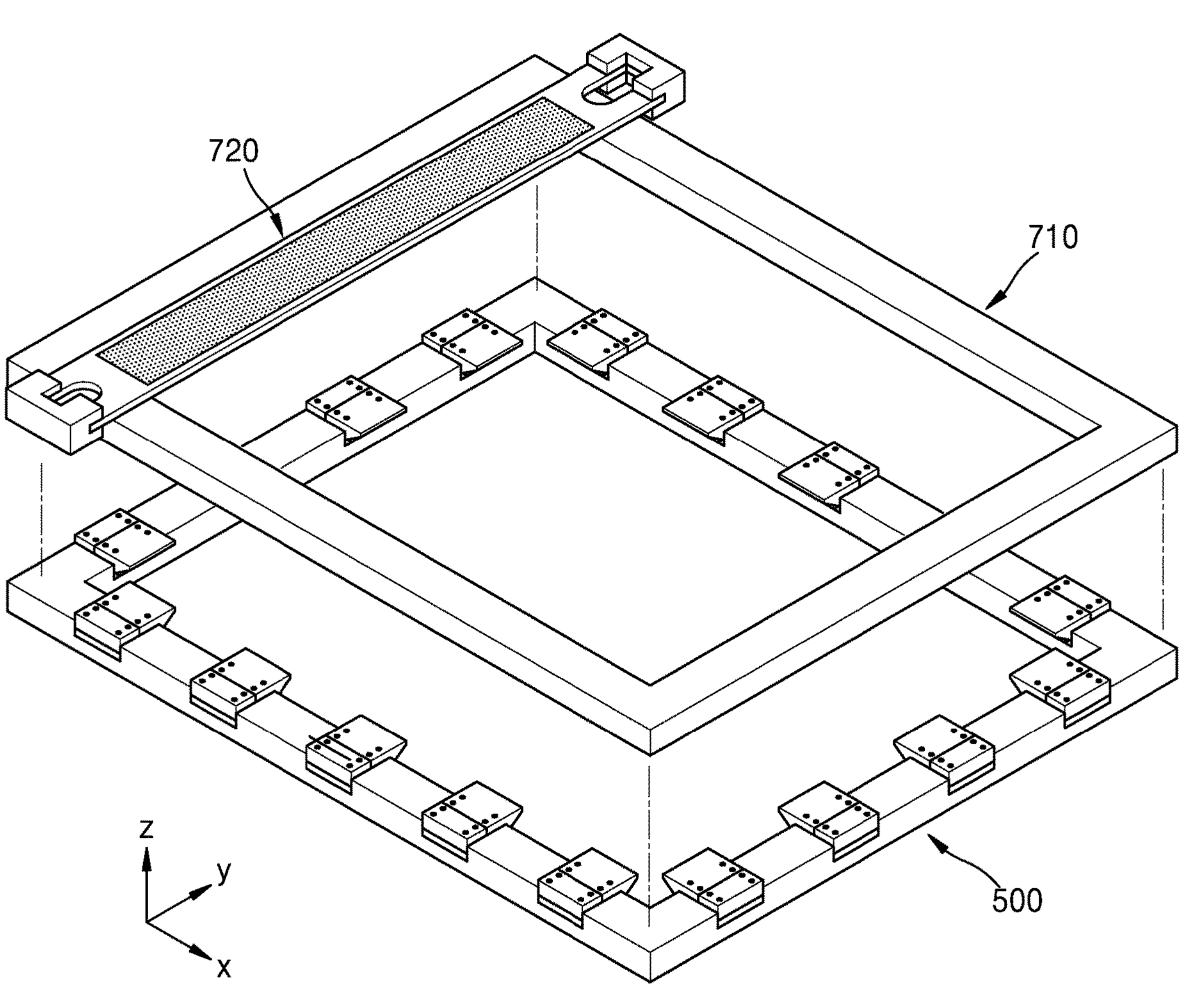
FIG. 5 is a view schematically illustrating a method of manufacturing a mask assembly, according to an embodiment.

FIG. 5 is a view schematically illustrating a method of manufacturing a mask assembly, according to an embodiment.

In an embodiment, the method of manufacturing a mask assembly may be implemented using the mask stage 500 and/or the mask assembly manufacturing apparatus 3 including the mask stage 500 described above.

Referring to FIG. 5, the mask stage 500 as described above may be disposed. As described above, the plates 510 may be arranged adjacent to each other and may be connected to each other by the connection portion 520. The size of the mask stage 500 may be assembled to correspond to the size of the mask frame 710.

The mask frame 710 may be seated on the mask stage 500. The height of the connection portion 520 may be greater than the height of the plate 510 and the mask frame 710 may be seated on the connection portion 520.

The mask frame 710 may be seated on the connection portion 520, and the height of the connection portion 520 may be adjusted. The height of the connection portion 520 is adjusted through the height adjustment part 530 to adjust the flatness of the mask frame 710. In an embodiment, the vision part 640 may measure the flatness of the mask frame 710 to specify positions where the height adjustment of the mask frame 710 is required. The flatness of the mask frame 710 may be adjusted by inserting the height adjustment part 530 such as a shim in the connection portion 520 where height adjustment is required.

Air may be injected through the air hole 527 of the connection portion 520. Accordingly, the gravity of the mask frame 710 may be partially offset, and a frictional force between the mask frame 710 and the connection portion 520 may be reduced. Because the height of the plate 510 is less than the height of the connection portion 520, an empty space may be formed between the mask frame 710 and the plate 510. Air injected through the mask frame 710 may be smoothly discharged through the empty space after the air meets a lower surface of the mask frame 710.

The mask sheet 720 may be on the mask frame 710 seated on the mask stage 500. In FIG. 5, only one of the sticks of the mask sheet 720 is illustrated for convenience of description. As described above, because the flatness of the mask frame 710 is adjusted, the mask sheet 720 may be disposed flatly without a difference in height. Both ends of the mask sheet 720 in a longitudinal direction (e.g., the y direction in FIG. 5) may be clamped by the clamp 630. The clamp 630 may prevent sagging of the mask sheet 720 that may occur over time by stretching the mask sheet 720 in the longitudinal direction.

The mask sheet 720 may be welded to the mask frame 710 by the welding part 620 (see FIG. 4) in a stretched state. In an embodiment, the mask sheet 720 may be laser welded to the mask frame 710.

After the mask sheet 720 is welded to the mask frame 710, the clamp 630 may release the mask sheet 720, and the ends of the mask sheet 720 may be cut to a required size.

Figure 6:
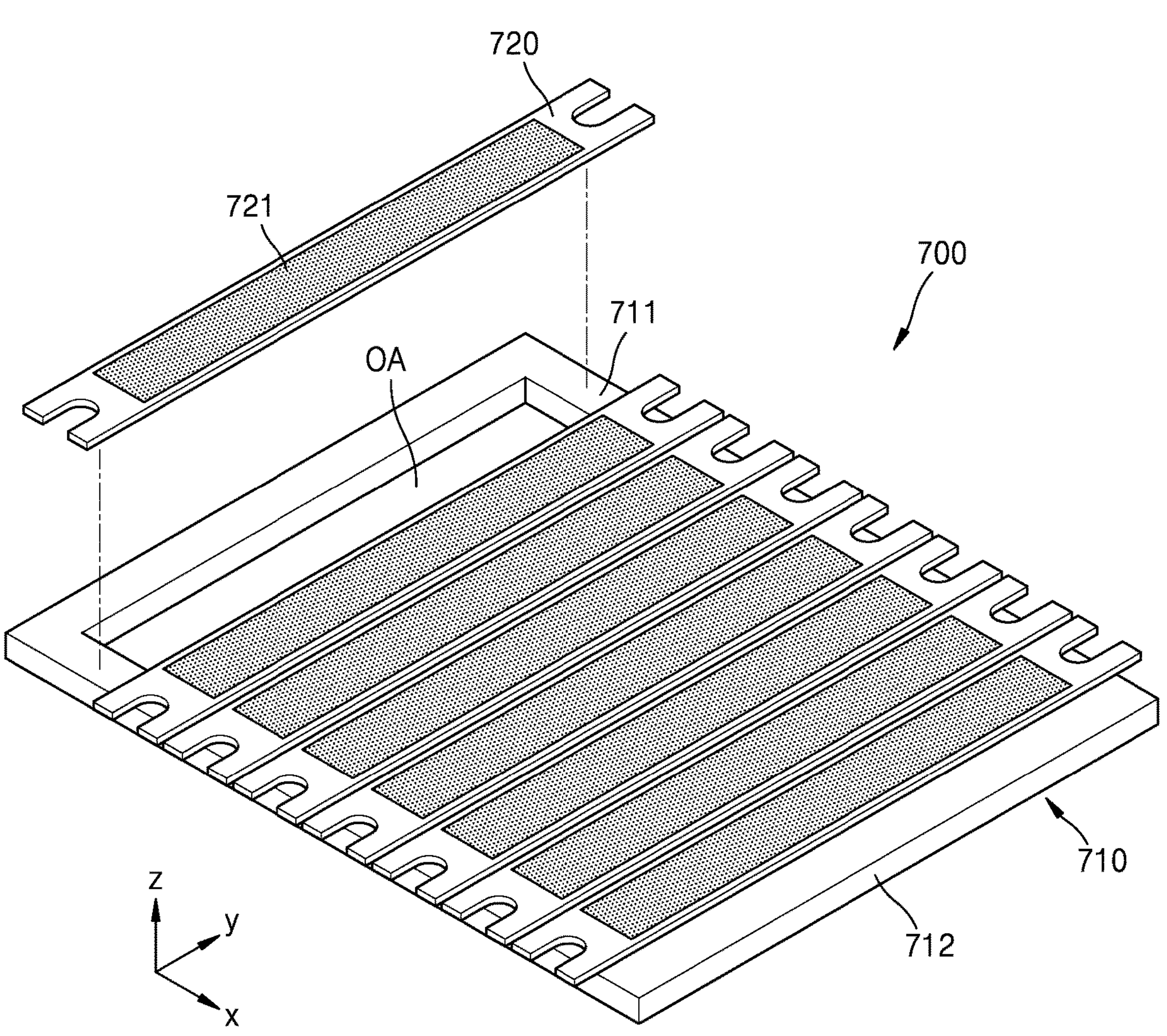
FIG. 6 is a schematic perspective view illustrating an example of a mask assembly manufactured using a mask stage according to an embodiment.

FIG. 6 is a schematic perspective view illustrating an example of the mask assembly 700 manufactured using the mask stage 500 according to an embodiment.

The mask assembly 700 may include the mask frame 710 and the mask sheet 720.

The mask frame 710 may include a first frame 711 extending in a first direction (e.g., the x direction in FIG. 6). The first frame 711 may be formed as a pair of frames facing each other and parallel to each other. The mask frame 710 may include a second frame 712 extending in a second direction (e.g., the y direction in FIG. 6). The second frame 712 may be formed as a pair of frames facing each other and parallel to each other. The first frame 711 and the second frame 712 may intersect each other, for example, at right angles. The profile of the mask frame 710 formed by the first frame 711 and the second frame 712 may be rectangular. The mask frame 710 may include an opening area OA in the center of the mask frame 710 formed by the first frame 711 and the second frame 712. In an embodiment, the mask frame 710 may be formed of a material resistant to deformation when welding the mask sheet 720. For example, the mask frame 710 may be formed of a metal with high rigidity.

The mask sheet 720 may close the opening area OA of the mask frame 710 and may be fixed to the mask frame 710. The mask sheet 720 may be provided as one sheet, or may be provided as multiple sticks as shown in FIG. 6. Hereinafter, the mask sheet 720 will be described as being provided by multiple sticks. mask sheets 720 may be arranged side-by-side in a direction. Each of the mask sheets 720 may be welded to and fixed to the mask frame 710.

In an embodiment, the mask sheet 720 may include openings 721. The openings 721 may form a pattern. The pattern may correspond to a deposition pattern formed on a substrate by a deposition material passing through an opening 721.

Figure 7:
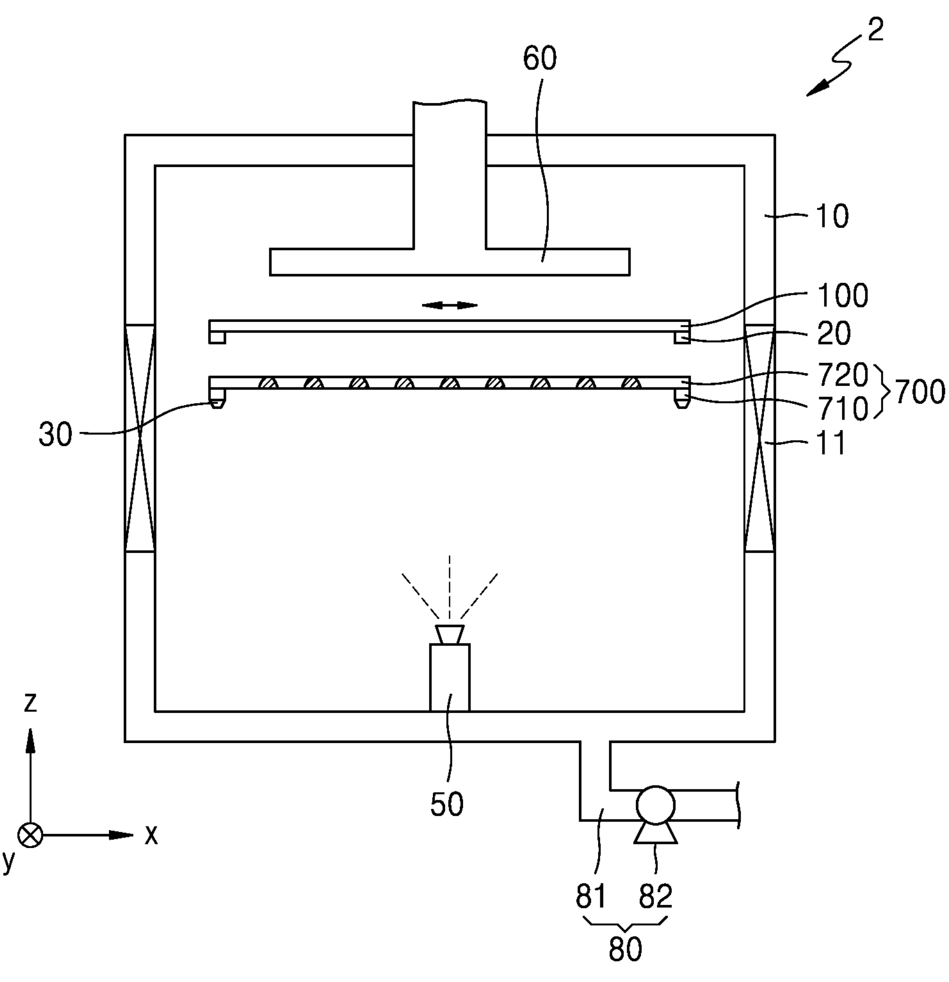
FIG. 7 is a view schematically illustrating a display device manufacturing apparatus according to an embodiment.

FIG. 7 schematically illustrates a display device manufacturing apparatus 2 according to an embodiment.

In an embodiment, the display device manufacturing apparatus 2 may include the mask assembly 700 described above, but is not limited thereto. In an embodiment, the display device manufacturing apparatus 2 may include the mask stage 500 as described below.

Referring to FIG. 7, the display device manufacturing apparatus 2 may include a chamber 10, a first support part 20, a second support part 30, a mask assembly 700, a deposition source 50, a magnetic force portion 60, and a pressure adjustment part 80.

The chamber 10 may have a space formed inside, and a portion of the chamber 10 may be opened. A gate valve 11 may be installed on the opened portion of the chamber 10. The opened portion of the chamber 10 may be opened or closed according to the operation of the gate valve 11.

The first support part 20 may seat and support a display substrate 100. The first support part 20 may be a plate fixed inside the chamber 10. In other examples, the first support part 20 may have a shuttle shape in which the display substrate 100 is seated and may be linearly movable within the chamber 10. In other examples, the first support part 20 may include an electrostatic chuck or an adhesive chuck fixed to the chamber 10 or disposed in the chamber 10 to be able to move up and down inside the chamber 10. Hereinafter, for convenience of description, the first support part 20 will be described as a plate fixed inside the chamber 10.

The mask assembly 700 may be seated on the second support part 30. The second support part 30 may be inside the chamber 10. The second support part 30 may be able to fine-tune the position of the mask assembly 700.

In an embodiment, the second support part 30 may include the mask stage 500 described above. For example, the mask stage 500 may be installed in the chamber 10 to support the mask assembly 700. Flatness adjustment of the mask assembly 700 may also be required in the display device manufacturing apparatus 2. Accordingly, the flatness or alignment of the mask assembly 700 may be easily adjusted through the height adjustment part 530 of the mask stage 500.

The mask stage 500 provided in the display device manufacturing apparatus 2 may be a separate mask stage having the same function as that of a mask stage provided in the mask assembly manufacturing apparatus 3 (refer to FIG. 4), or the same mask stage 500 may be disposed in the display device manufacturing apparatus 2 by moving the mask stage 500 from the mask assembly manufacturing apparatus 3. The height may have been adjusted for the mask assembly 700 in the mask assembly manufacturing apparatus 3. By using the mask stage 500 having a height that is already adjusted for the mask assembly 700 again, the alignment of the mask assembly 700 in the display device manufacturing apparatus 2 may not require readjustment. Accordingly, work efficiency may be improved.

The mask assembly 700 may be selectively disposed on the second support part 30 inside the chamber 10. The mask assembly 700 may be the mask assembly 700 as described above. The mask assembly 700 may include the mask frame 710 and the mask sheet 720. The mask sheet 720 may be fixed to the mask frame 710 in a stretched state.

The deposition source 50 may be disposed to face the mask assembly 700. The deposition material may be accommodated in the deposition source 50, and the deposition material may be evaporated or sublimated by applying heat to the deposition material. The deposition source 50 may be disposed to be fixed inside the chamber 10 or disposed inside the chamber 10 to be able to move linearly in one direction. However, hereinafter, for convenience of description, the deposition source 50 is illustrated as being fixed inside the chamber 10. The deposition material evaporated from the deposition source 50 may pass through the mask assembly 700 and be deposited on the display substrate 100 to form a layer.

The magnetic force portion 60 may be disposed inside the chamber 10 to face the display substrate 100. The magnetic force portion 60 may apply a magnetic force to the mask assembly 700 to press the mask assembly 700 toward the display substrate 100. The magnetic force portion 60 may prevent the mask sheet 720 from sagging and may make the mask sheet 720 be adjacent to the display substrate 100. The magnetic force portion 60 may maintain a uniform distance between the mask sheet 720 and the display substrate 100.

The pressure adjustment part 80 is connected to the chamber 10 and may adjust pressure inside the chamber 10. For example, the pressure adjustment part 80 may adjust the pressure inside the chamber 10 to be substantially similar to atmospheric pressure. In other examples, the pressure adjustment part 80 may adjust the pressure inside the chamber 10 to be substantially similar to a vacuum state.

The pressure adjustment part 80 may include a connection pipe 81 connected to the chamber 10, and a pump 82 formed on the connection pipe 81. The pump 82 may introduce external air into the chamber 10 through the connection pipe 81, or the gas inside the chamber 10 may be guided to the outside through the connection pipe 81.

Figure 8:
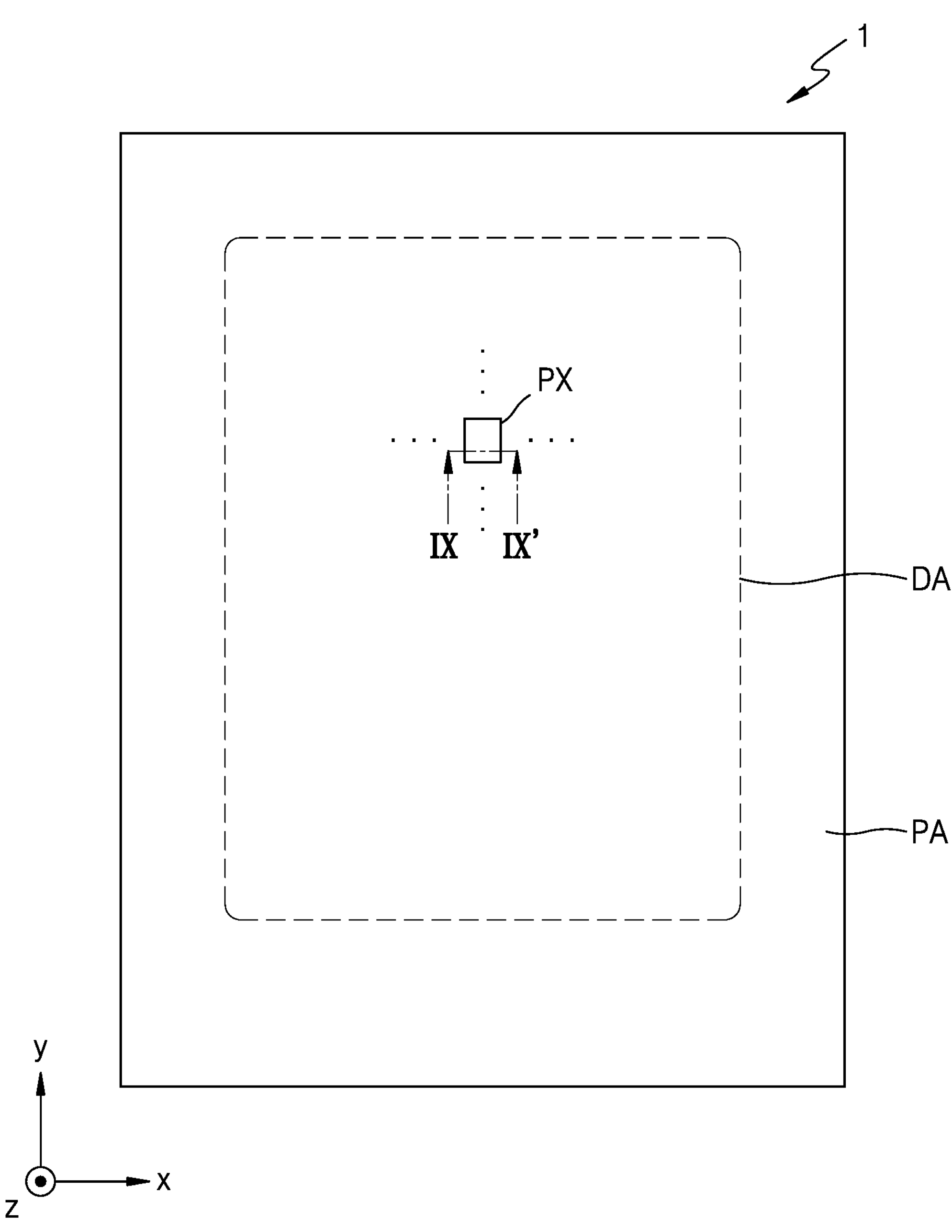
FIG. 8 is a plan view schematically illustrating a display device according to an embodiment.

The display device manufacturing apparatus 2 as described above may be used to manufacture a display device 1 (refer to FIG. 8). In case that the pressure adjustment part 80 makes the pressure inside the chamber 10 be the same as or similar to atmospheric pressure, the gate valve 11 may operate to open an opening of the chamber 10.

Thereafter, the display substrate 100 may be loaded from the outside of the chamber 10 to the inside of the chamber 10. The display substrate 100 may be loaded into the chamber 10 in various ways. For example, the display substrate 100 may be loaded into the chamber 10 from the outside by a robot arm disposed outside the chamber 10. In other examples, when the first support part 20 has a shuttle shape, after the first support portion 20 is carried from the inside to the outside of the chamber 10, the display substrate 100 may be seated on the first support part 20 by a separate robot arm disposed outside the chamber 10, and the first support portion 20 may be loaded into the chamber 10 from the outside of the chamber 10. Hereinafter, for convenience of description, a case in which the display substrate 100 is loaded into the chamber 10 from the outside by the robot arm disposed outside the chamber 10 is described in detail.

The mask assembly 700 may be disposed in the chamber 10 as described above. In other examples, the mask assembly 700 may be loaded from the outside into the chamber 10 in the same or similar manner as the display substrate 100. For convenience of description, the mask assembly 700 will be described as already having been disposed inside chamber 10 when the display substrate 100 is loaded into the chamber 10.

In other examples, the first support part 20 and the second support part 30 may fix the display substrate 100 to the mask assembly 700 in a shuttle shape, and then load the display substrate 100 and the mask assembly 700 from the outside of the chamber 10 into the chamber 10.

When the display substrate 100 is loaded into the chamber 10, the display substrate 100 may be seated on the first support portion 20, and the mask assembly 700 may be seated on the second support part 30.

The deposition source 50 may operate to supply a deposition material toward the mask assembly 700, and the deposition material passing through openings of the mask sheet 720 may be deposited on the display substrate 100. The pump 82 may maintain the pressure inside the chamber 10 to be substantially similar to a vacuum by sucking gas from inside the chamber 10 and discharging the gas to the outside.

The deposition material may be deposited on the display substrate 100 through an opening of the mask assembly 700. The mask assembly 700 may provide a patterned opening corresponding to an area to be deposited on the display substrate 100. Accordingly, multiple layers that comprise display device 1 (refer to FIGS. 8 and 9) may be stacked on the display substrate 100. For example, a metal layer may be formed on the display substrate 100.

FIG. 8 is a plan view schematically illustrating a display device according to an embodiment. The display device 1 may be manufactured by using the display device manufacturing apparatus 2 described above.

Referring to FIG. 8, the display device 1 manufactured according to an embodiment may include a display area DA and a peripheral area PA located outside the display area DA. The display device 1 may provide an image through an array of pixels PX that are two-dimensionally arranged in the display area DA.

The peripheral area PA may not provide an image, and may entirely or partially surround the display area DA. A driver for providing electric signals or power to pixel circuits corresponding to each of the pixels PX may be disposed in the peripheral area PA. A pad, which electrically connects an electronic device or a printed circuit board to display device 1, may be disposed in the peripheral area PA.

Hereinafter, display device 1 is described as including an organic light-emitting diode OLED as a light-emitting element, but the display device 1 of the disclosure is not limited thereto. In an embodiment, the display device 1 may be a light-emitting display device including an inorganic light-emitting diode, for example, an inorganic light-emitting display. The inorganic light-emitting diode may include a PN diode including inorganic semiconductor-based materials. When a voltage is applied to a PN junction diode in the forward direction, holes and electrons are injected, and energy generated by recombination of the holes and electrons is converted into light energy to emit light of a selected color. The inorganic light-emitting diode described above may have a width in a range of several to several hundred micrometers, and in some embodiments, the inorganic light-emitting diode may be referred to as a micro LED. In other examples, the display device 1 may be a quantum dot light-emitting display.

The display device 1 may be used as a display screen of various products such as a television, a laptop computer, a monitor, a billboard, and the Internet of Things (IOT), as well as portable electronic devices such as a mobile phone, a smartphone, a tablet personal computer (PC), a mobile communication terminal, an electronic notebook, an e-book, a portable multimedia player (PMP), a navigation, and an ultra-mobile PC (UMPC). The display device 1 according to an embodiment may be used in a wearable device such as a smart watch, a watch phone, an eyeglass mounted display, or a head mounted display (HMD). The display device 1 according to an embodiment may be used as a dashboard of a vehicle, a center information display (CID) placed on a center fascia or a dashboard of a vehicle, augmented mirror displays that may replace the side mirrors of a vehicle, or a display screen on a rear surface of a front seat as entertainment for a rear passenger of a vehicle.

Figure 9:
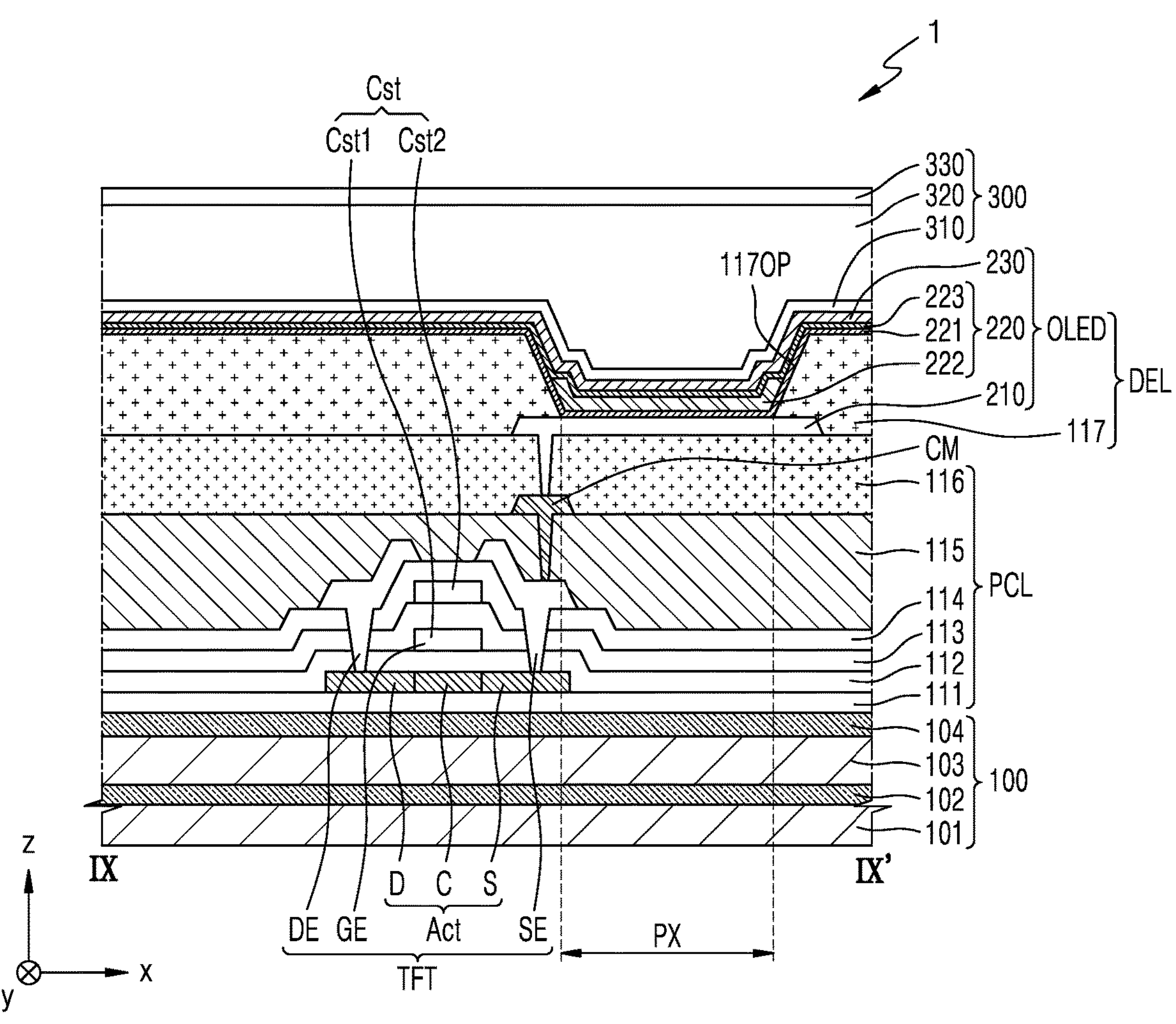
FIG. 9 is a cross-sectional view schematically illustrating a display device manufactured by using a display device manufacturing apparatus according to an embodiment.

FIG. 9 is a cross-sectional view schematically illustrating a display device manufactured by using a display device manufacturing apparatus according to an embodiment, and may correspond to a cross-section of the display device taken along line IX-IX' of FIG. 8.

Referring to FIG. 9, the display device 1 may include a stacked structure of a substrate 100, a pixel circuit layer PCL, a display element layer DEL, and an encapsulation layer 300.

The substrate 100 may have a multilayer structure including a base layer including a polymer resin and an inorganic layer. For example, the substrate 100 may include a base layer including a polymer resin and a barrier layer of an inorganic insulating layer. For example, the substrate 100 may include a first base layer 101, a first barrier layer 102, a second base layer 103, and a second barrier layer 104 sequentially stacked. The first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (TAC), or/and cellulose acetate propionate (CAP). The first barrier layer 102 and the second barrier layer 104 may include an inorganic insulating material such as silicon oxide, silicon oxynitride, and/or silicon nitride. The substrate 100 may be flexible.

A pixel circuit layer PCL may be on the substrate 100. FIG. 9 illustrates that the pixel circuit layer PCL includes a thin-film transistor TFT, a buffer layer 111 below or/and above the components of the thin-film transistor TFT, a first gate-insulating layer 112, a second gate-insulating layer 113, an interlayer insulating layer 114, a first planarization-insulating layer 115, and a second planarization-insulating layer 116.

The buffer layer 111 may reduce or prevent the penetration of foreign materials, moisture, or external air from a lower portion of the substrate 100 and may provide a flat surface on the substrate 100. The buffer layer 111 may include an inorganic insulating material such as silicon oxide, silicon oxynitride, or silicon nitride, and may have a single layer or multilayer structure including the materials described above.

The thin-film transistor TFT on the buffer layer 111 may include a semiconductor layer Act, and the semiconductor layer Act may include polysilicon. In other examples, the semiconductor layer Act may include amorphous silicon, an oxide semiconductor, an organic semiconductor, or the like. The semiconductor layer Act may include a channel area C, and a drain area D and a source area S arranged at both sides of the channel area C, respectively. A gate electrode GE may overlap the channel area C.

The gate electrode GE may include a low electrical resistance metal material. The gate electrode GE may include a conductive material including molybdenum (Mo), aluminum (Al), copper (Cu), titanium (Ti), or the like, and may be formed as a single layer or layers including the materials described above.

The first gate-insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The second gate-insulating layer 113 may cover the gate electrode GE. Similar to the first gate-insulating layer 112, the second gate-insulating layer 113 may include an inorganic insulating material such as $SiO_2$, SiNx, SiON, $Al_2O_3$, TiO2, $Ta_2O_5$, $HfO_2$, or $ZnO_x$. Zinc oxide (ZnOx) may be zinc oxide (ZnO) and/or zinc peroxide ($ZnO_2$).

An upper electrode Cst2 of a storage capacitor Cst may be on the second gate-insulating layer 113. The upper electrode Cst2 may overlap the gate electrode GE therebelow. The gate electrode GE and the upper electrode Cst2 overlapping each other with the second gate-insulating layer 113 therebetween may form the storage capacitor Cst. The gate electrode GE may function as a lower electrode Cst1 of the storage capacitor Cst.

As such, the storage capacitor Cst and the thin-film transistor TFT may overlap each other. In some embodiments, the storage capacitor Cst may not overlap the thin-film transistor TFT.

The upper electrode Cst2 may include Al, Pt, Pd, Ag, Mg, Au, Ni, Nd, Ir, Cr, Ca, Mo, Ti, W and/or Cu, and may be a single layer or layers of the material described above.

The interlayer insulating layer 114 may cover the upper electrode Cst2. The interlayer insulating layer 114 may include $SiO_2$, SiNx, SiON, $Al_2O_3$, TiO2, $Ta_2O_5$, $HfO_2$, or ZnOx. ZnOx may be ZnO and/or $ZnO_2$. The interlayer insulating layer 114 may include a single layer or layers including the inorganic insulating material described above.

A drain electrode DE and a source electrode SE may each be on the interlayer insulating layer 114. The drain electrode DE and the source electrode SE may be electrically connected to the drain area D and the source area S through contact holes formed in insulating layers below the drain electrode DE and the source electrode SE, respectively. The drain electrode DE and the source electrode SE may include a conductive material. The drain electrode DE and the source electrode SE may include a conductive material including Mo, Al, Cu, Ti, and the like, and may be formed as a single layer or layers including the material described above. In an embodiment, the drain electrode DE and the source electrode SE may have a multilayer structure of Ti/Al/Ti.

The first planarization-insulating layer 115 may cover the drain electrode DE and the source electrode SE. The first planarization-insulating layer 115 may include an organic insulation material such as a general commercial polymer such as polymethylmethacrylate (PMMA) or polystyrene (PS), a polymer derivative including a phenolic group, an acrylic polymer, an imide polymer, an aryl ether polymer, an amide polymer, a fluorine-based polymer, a p-xylene-based polymer, a vinyl alcohol polymer, and/or a combination thereof.

The second planarization-insulating layer 116 may be disposed on the first planarization-insulating layer 115. The second planarization-insulating layer 116 may include the same material as that of the first planarization-insulating layer 115, and may include an organic insulation material such as a general commercial polymer such as PMMA or PS, a polymer derivative including a phenolic group, an acrylic polymer, an imide polymer, an aryl ether polymer, an amide polymer, a fluorine-based polymer, a p-xylene-based polymer, a vinyl alcohol polymer, and/or a combination thereof.

The display element layer DEL may be disposed on the pixel circuit layer PCL. The display element layer DEL may include the organic light-emitting diode OLED as a display element e.g., a light-emitting element), and the organic light-emitting diode OLED may include a stacked structure of a pixel electrode 210, an intermediate layer 220, and a common electrode 230. The organic light-emitting diode OLED may emit, for example, red, green, blue light, or white light. The organic light-emitting diode OLED emits light through a light-emitting area, and the light-emitting area may be defined as a pixel PX.

The pixel electrode 210 of the organic light-emitting diode OLED may be electrically connected to the thin-film transistor TFT through contact holes formed in the second planarization-insulating layer 116 and the first planarization-insulating layer 115, and a contact metal CM disposed on the first planarization-insulating layer 115.

The pixel electrode 210 may include a conductive oxide such as indium tin oxide (ITO), indium zinc oxide (IZO), zinc oxide (ZnO), indium oxide ($In_2O_3$), indium gallium oxide (IGO), and aluminum zinc oxide (AZO). In other examples, the pixel electrode 210 may include a reflective layer including Ag, Mg, Al, Pt, Pd, Au, Ni, Nd, Ir, Cr, or a compound thereof. In an embodiment, the pixel electrode 210 may further include a film formed of ITO, IZO, ZnO, or $In_2O_3$ above/below the reflective layer described above.

A pixel-defining layer 117 having an opening 117OP exposing a center portion of the pixel electrode 210 may be on the pixel electrode 210. The pixel-defining layer 117 may include an organic insulating material and/or an inorganic insulating material. The opening 117OP may define a light-emitting area of light emitted from the organic light-emitting diode OLED. For example, the size/width of the opening 117OP may correspond to the size/width of the light-emitting area. Accordingly, the size and/or width of the pixel PX may depend on the size and/or width of the opening 117OP of the pixel-defining layer 117.

The intermediate layer 220 may include an emission layer 222 that corresponds to the pixel electrode 210. The emission layer 222 may include a high-molecular weight organic material or a low-molecular weight organic material that emits light of a selected color. In other examples, the emission layer 222 may include an inorganic light-emitting material or quantum dots.

In an embodiment, the intermediate layer 220 may include a first functional layer 221 and a second functional layer 223 respectively disposed below and above the emission layer 222. The first functional layer 221 may include, for example, a hole transport layer (HTL) or a hole transport layer and a hole injection layer (HIL). The second functional layer 223 may be a component disposed on the emission layer 222, and may include an electron transport layer (ETL) and/or an electron injection layer (EIL). The first functional layer 221 and/or the second functional layer 223 may be a common layer that entirely overs the substrate 100, like the common electrode 230 described below.

The common electrode 230 may be disposed on the pixel electrode 210 and may overlap the pixel electrode 210. The common electrode 230 may be made of a conductive material having a low work function. For example, the common electrode 230 may include a (semi) transparent electrode including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In other examples, the common electrode 230 may further include a layer such as ITO, IZO, ZnO, or $In_2O_3$ on the (semi) transparent layer including the material described above. The common electrode 230 may be integrally formed as a single body to entirely cover the substrate 100.

The encapsulation layer 300 may be disposed on the display element layer DEL and cover the display element layer DEL. The encapsulation layer 300 includes at least one inorganic encapsulation layer and at least one organic encapsulation layer. As an embodiment, FIG. 9 illustrates that the encapsulation layer 300 includes a first inorganic encapsulation layer 310, an organic encapsulation layer 320, and a second inorganic encapsulation layer 330 sequentially stacked.

The first inorganic encapsulation layer 310 and the second inorganic encapsulation layer 330 may include one or more inorganic insulating materials such as aluminum oxide, titanium oxide, tantalum oxide, hafnium oxide, zinc oxide, silicon oxide, silicon nitride, and silicon oxynitride. The organic encapsulation layer 320 may include a polymer-based material. Examples of the polymer-based material may include an acrylic resin, an epoxy resin, polyimide, and/or polyethylene. In an embodiment, the organic encapsulation layer 320 may include acrylate. The organic encapsulation layer 320 may be formed by curing a monomer or applying a polymer. The organic encapsulation layer 320 may have transparency.

Although not shown, a touch sensor layer may be disposed on the encapsulation layer 300, and an optical functional layer may be disposed on the touch sensor layer. The touch sensor layer may obtain coordinate information according to an external input, for example, a touch event. The optical functional layer may reduce the reflectance of light (external light) incident from the outside toward the display device, and/or may improve the color purity of light emitted from the display device. In an embodiment, the optical functional layer may include a retarder and/or a polarizer. The retarder may be of a film type or a liquid crystal coating type, and may include a λ/2 retarder and/or a λ/4 retarder. The polarizer may also be of a film type or a liquid crystal coating type. The film type may include a stretch-type synthetic resin film, and the liquid crystal coating type may include liquid crystals disposed in a selected arrangement. The retarder and the polarizer may further include a protective film.

An adhesive member may be disposed between the touch sensor layer and the optical functional layer. The adhesive member may employ a general member known in the art without limitation. The adhesive member may be a pressure sensitive adhesive (PSA).

According to embodiments, a mask stage may comprise of separate component parts that may be assembled to correspond to the size of a mask assembly.

According to embodiments, the height of the mask stage may be adjusted to facilitate planarization of the mask assembly.

According to embodiments, the mask stage may reduce frictional force between the mask assembly and the mask stage.

Effects of the disclosure are not limited to the effects mentioned above, and other effects not mentioned will be understood by those of ordinary skill in the art from the description of the claims.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A mask stage comprising:

plates disposed adjacent to each other, the plates forming a closed loop in a plan view; and a connection portion connecting adjacent ones among the plates to each other, the connection portion being detachable from the plates wherein the mask stage supports a mask frame, and a height of the mask stage is adjustable to facilitate planarization of a mask assembly.

2. The mask stage of claim 1, wherein a first plate among the plates and a second plate among the plates are adjacent to each other, and the connection portion is disposed on an upper portion of the plates, the connection portion overlapping portions of the first plate and the second plate in a thickness direction of the plates.

3. The mask stage of claim 2, wherein the connection portion, the first plate, and the second plate are fastened together by a fastener.

4. The mask stage of claim 1, wherein each of the plates includes:

a first area in which the connection portion is seated; and a second area connected to the first area, and a thickness of the plates in the first area is less than another thickness of the plates in the second area.

5. The mask stage of claim 4, wherein a sum of the thickness of the plates in the first area and a thickness of the connection portion is greater than the another thickness of the plates in the second area.

6. The mask stage of claim 4, wherein the first area includes:

a height adjustment part disposed between the plates and the connection portion.

7. The mask stage of claim 6, wherein the height adjustment part includes a shim.

8. The mask stage of claim 1, wherein the connection portion comprises:

a first block disposed in an inner direction with respect to the closed loop; and a second block disposed in an outer direction with respect to the closed loop and disposed parallel to the first block.

9. The mask stage of claim 8, wherein an area of the first block in a plan view is different from an area of the second block in a plan view.

10. The mask stage of claim 1, wherein the connection portion comprises an air hole that passes through an inside of the connection portion and injects air in a direction opposite to a direction in which the mask frame is supported.

11. The mask stage of claim 10, wherein air holes are spaced apart from each other in a longitudinal and a width direction of the connection portion.

* * * * *